United States Patent [19]
Son

[11] Patent Number: 5,877,939
[45] Date of Patent: Mar. 2, 1999

[54] SNAP DOOR FOR A HOUSEHOLD ELECTRIC APPLIANCE

[75] Inventor: Chi-Wang Son, Suwon, Rep. of Korea

[73] Assignee: Samsung Electronics Co., Ltd., Kyungki-Do, Rep. of Korea

[21] Appl. No.: 895,277

[22] Filed: Jul. 16, 1997

[51] Int. Cl.⁶ .................................................. H02B 1/04
[52] U.S. Cl. ..................... 361/727; 348/836; 361/609; 361/754
[58] Field of Search ................................... 361/608, 609, 361/615, 616, 622, 682, 686, 736, 725–727, 752, 754; 439/131; 200/5 A, 292, 61.61, 332.1; 348/553, 725, 731, 836, 839

[56] References Cited

U.S. PATENT DOCUMENTS

| | | |
|---|---|---|
| 4,809,360 | 2/1989 | Kraft . |
| 5,140,346 | 8/1992 | Goto . |
| 5,269,698 | 12/1993 | Singer . |
| 5,340,340 | 8/1994 | Hastings . |
| 5,598,319 | 1/1997 | Lee . |
| 5,654,870 | 8/1997 | Havener . |
| 5,815,369 | 9/1998 | Quesada . |

*Primary Examiner*—Gerald Tolin
*Attorney, Agent, or Firm*—Sughrue, Mion, Zinn, Macpeak & Seas, PLLC

[57] ABSTRACT

A snap door including a door housing, a door body, a latch switch and a spring, in which one side of a lower plane of the door housing is open for placing a PCB mounted with plural control switches therein. The door body includes a lower case, an upper cover, a knob assembly and a front cover. The knob assembly has a knob holder, plural remote control knobs and plural resilient bridge portions extending between the knob holder and remote control knobs. The knob holder is attached to a lower plane of the upper cover. Respective remote control knobs are formed by extension members extending to the rear side from the resilient bridge portions of the knob assembly, control buttons projectingly installed to the front side of upper planes of the extension members, and switch operative projections protrudingly installed to lower planes of the extension members. Respective remote control knobs are arranged to allow the switch operative projections to be placed on the upper portions of the control switches on the PCB.

9 Claims, 11 Drawing Sheets

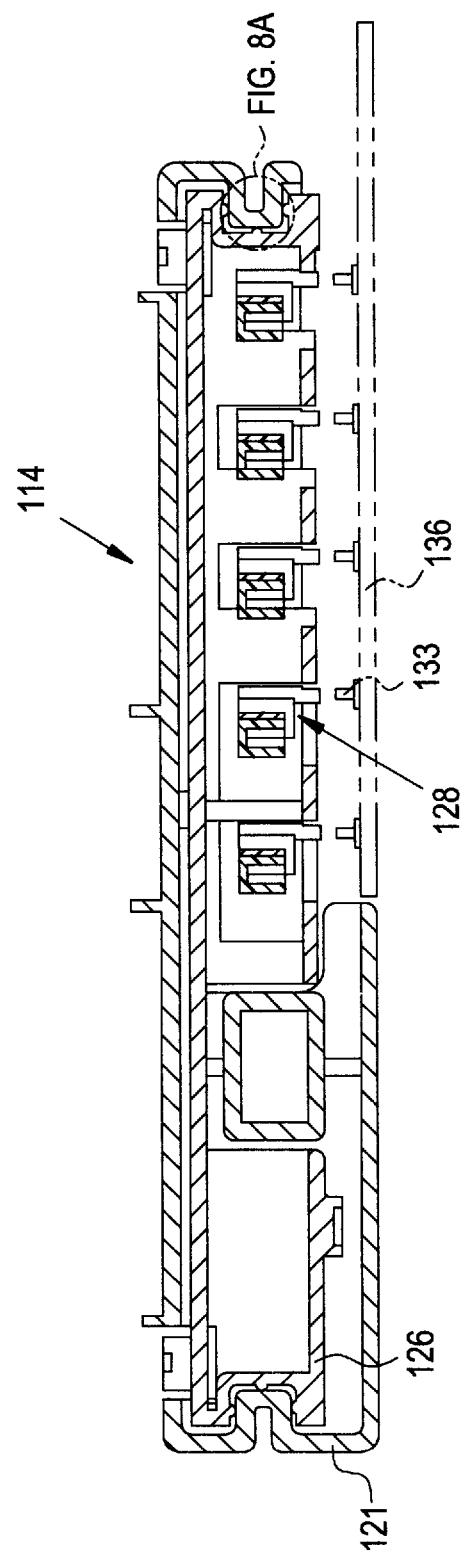
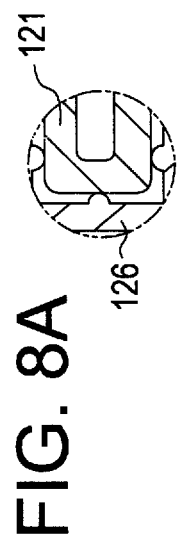

SNAP DOOR FOR A HOUSEHOLD ELECTRIC APPLIANCE

BACKGROUND OF THE INVENTION

1. Field of the Invention

The present invention relates to a so-called snap door used for a household electric appliance such as a television, and more particularly, as illustrated in FIG. 1, to a snap door 14, which is mounted so as to be able to protrude forward and backward with respect to a cabinet 13 of a household electric appliance 11, such as a television, thereby exposing control knobs 12 at the front side of cabinet 13 or hiding control knob 12 inside the cabinet 13.

2. Description of the Prior Art

FIG. 2 shows a conventional snap door 14 of a household electric appliance functioning as stated above. The snap door 14 is formed by a door housing 21 and a door body 22 coupled to slidably move forward and backward with respect to the door housing 21. Also included as parts of the snap door 14 are a latch switch 23 for locking the door body 22 in the door housing 21, and a pair of compression springs 24a and 24b for pushing the door body 22 out of the front side of the door housing 21 when the latch switch 23 is released.

The door body 22 includes a lower case 26, an upper cover 27 coupled to lower case 26 by means of a pair of screws (not shown), and a knob assembly 28 provided to one side of the bottom plane of the upper cover 27. Additionally, a front cover 29 is joined to one side of the front of the lower case 26 and the upper cover 27.

The knob assembly 28 has a knob holder 30 and a plurality of control knobs 12. Also, a plurality of resilient bridge portions 32 extend between the knob holder 30 and the control knobs 12. The knob assembly 28 is attached to the lower plane of the upper cover 27 by means of the knob holder 30.

A sub-PCB 34 disposed with a plurality of control switches 33 is arranged in the lower case 26 below the knob assembly 28 in such a manner that the control switches 33 are positioned to underlie directly the respective control knobs 12. Thus, signals generated by control switches 33 are supplied via a connector wire 35 to a main PCB 36 positioned at the rear side of snap door 14.

The latch switch 23 is arranged at the rear side of an upper center plane of the door housing 21, and a hook 31 is projectingly installed on the lower case 26 of the door body 22 in a position corresponding to that of the latch switch 23 so that it will engage the latch switch 23 thereby locking the door body 22 inside the door housing.

Reference numerals 37a and 37b denote stoppers for preventing the forward deviation of the door body 22 from the door housing 21 induced by a biasing force of springs 24a and 24b. Reference 38 is a damper gear for preventing abrupt motion of the door body 22 when it is slidably moved with respect to the door housing 21. Reference 39 is a rack which is disposed on one side and at the rear of the lower case 26 of the door body 22, and meshes with a damper gear 38.

As shown in FIG. 3, the conventional snap door 14 is mounted in the cabinet 13 of a household electric appliance 11, such as the television, by means of a plurality of screws 25a and 25b. When a user of the household electric appliance 11 presses the closed front plane of the door body 22 as shown generally in FIG. 1, the latch switch 23 caught in a hook 31 is released to allow the door body 22 to open and protrude to the front side of the household electric appliance 11 as a result of the biasing force of the springs 24a and 24b.

Once the door body 22 opens, as shown in FIG. 2, the control knobs 12 are exposed to enable the user of the household electric appliance 11 to press a control knob 12 for manipulating the control switches 33, thereby making it possible to operate the household electric appliance 11.

The door body 22 is closed by the user pressing the front plane of the door body 22, thereby overcoming the biasing force of the springs 24a and 24b. The hook 31 catches the latch switch 23 to hold the door body closed, thereby concealing the control knobs 12.

However, in the conventional snap door 14 formed as above, and as shown in FIG. 3, the main PCB 36 is placed to the rear of the snap door 14. For this reason, the main PCB 36 is positioned at the rear of the cabinet 13 and recessed at least the length of the snap door 14. This causes a problem in that the household electric appliance 11 becomes bulky.

The conventional snap door 14 is constructed in such a manner that the main PCB 36 is separated from the snap door 14 as shown in FIGS. 2 and 3. This results in a drawback of additionally requiring the sub-PCB 34 for arranging the control switches 33 at the lower portion of control knobs 12 and the separate connector wire 35 for connecting the sub-PCB 34 to the main PCB 36.

Also, since the main PCB 36 is spaced apart from the front plane of the household electric appliance 11 by at least the length of the snap door 14, there is a need for a separate control PCB 34a for installing a power switch or remote-controller receiving portion and a separate connector wire 35a for connecting the control PCB 34a to the main PCB 36 in the vicinity of the front plane of the household electric appliance 11.

Furthermore, as shown in FIG. 3, since the main PCB 36 is separated from the front plane of the household electric appliance 11 by sufficient space to secure an operating distance for the snap door 14, there is the additional drawback of requiring a PCB holder 36a for fixing the main PCB 36.

Additionally, since the conventional snap door 14 has a door body 22, which is supported by a pair of springs 24a and 24b, it is difficult to provide a consistent and even spring force on both sides of the door body 22, with the consequence of incurring side-to-side shaking of the door body 22 with respect to door housing 21 when opening or closing the snap door 14.

Also, the conventional snap door 14 of the household electric appliance formed as described above has no means for preventing any upward and downward shaking of the door body 22 with respect to the door housing 21 when the door body 22 protrudes to the front of the door housing 21. Because of this fact, the door body 22 is shaken upward and downward against the door housing 21 whenever the user presses a control knob 12 of the door body 22.

SUMMARY OF THE INVENTION

Accordingly, the present invention is designed to solve the above-described problems. It is an object of the present invention to provide a snap door of a household electric appliance capable of remarkably reducing the overall size of the household electric appliance installed with the snap door, while eliminating the need for separate parts, such as a sub-PCB, a control PCB, a connector wire, or a PCB holder, heretofore required in installing a conventional snap door.

It is another object of the present invention to provide a snap door that will not cause shaking of the door body of the snap door with respect to the door housing when a user presses a control knob of the snap door when the snap door is open and when the user opens and closes the snap door.

To achieve the above objects of the present invention, there is provided a snap door including a door housing having one side of a lower plane thereof opened for permitting a PCB mounted with a plurality of control switches to be placed therein. A door body is coupled slidably to move forward and backward with respect to the door housing while having a plurality of remote control knobs arranged for allowing one of the ends of the rear sides to be placed at the respective upper portions of the control switches on the PCB. Further, the snap door includes a unit for locking the door body in the door housing, and a unit for ejecting the door body out of the door housing when the door locking unit is released.

The lower plane of the door housing has a slot, i.e. is partially open, so that the main PCB with the plurality of control switches fits therein, whereby respective control switches on the main PCB can be directly manipulated by means of the remote control knobs. Therefore, the overall size of the household electric appliance installed with the snap door can be remarkably reduced, and, furthermore, separate parts, such as the sub-PCB, control PCB, connector wire, or PCB holder, are not required in installing the snap door.

In the preferred embodiment of the present invention, the door body is ejected by means of a single tension spring of which both ends are supported by both rear sides of the door housing. This structure causes the spring to consistently exert a force upon the door body and prevent the shaking of the door body against the door housing during opening/closing the snap door.

Preferably, when the door body is fully ejected from the door housing, small protrusions in the stoppers of the door body and small slots of the door housing are fitted with each other to thereby prevent the door body of the snap door from shaking against the door housing even when a user of the household electric appliance presses a knob of the open snap door.

BRIEF DESCRIPTION OF THE DRAWINGS

The above objects and other advantages of the present invention will become more apparent by describing in detail preferred embodiments thereof with reference to the attached drawings in which:

FIG. 8 is a sectional view taken along line VIII—VIII of FIG. 6;

DETAILED DESCRIPTION OF THE PREFERRED EMBODIMENT

Figure 1:
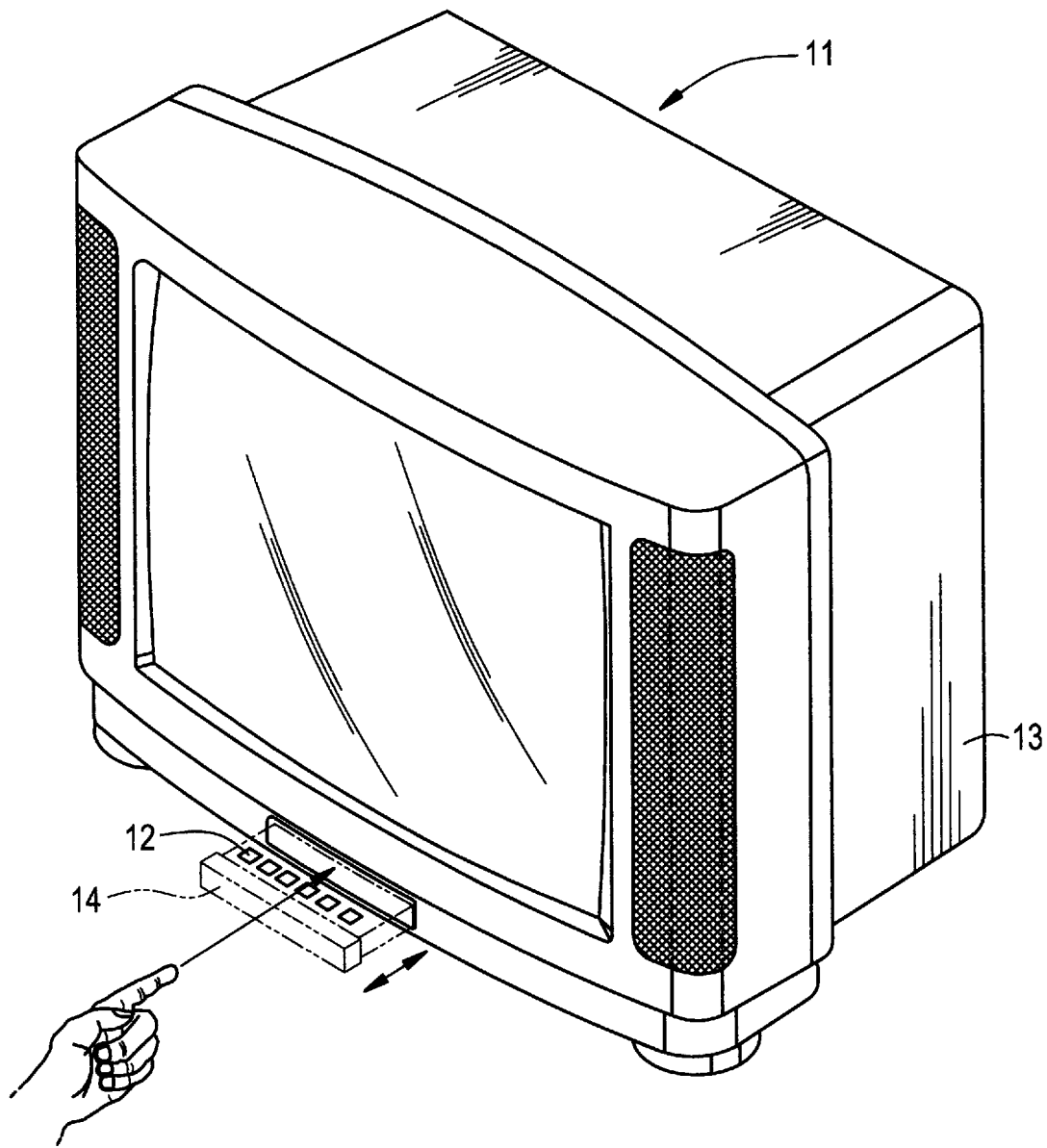
FIG. 1 is a perspective view showing the external appearance of a television mounted with a general snap door.
Figure 2:
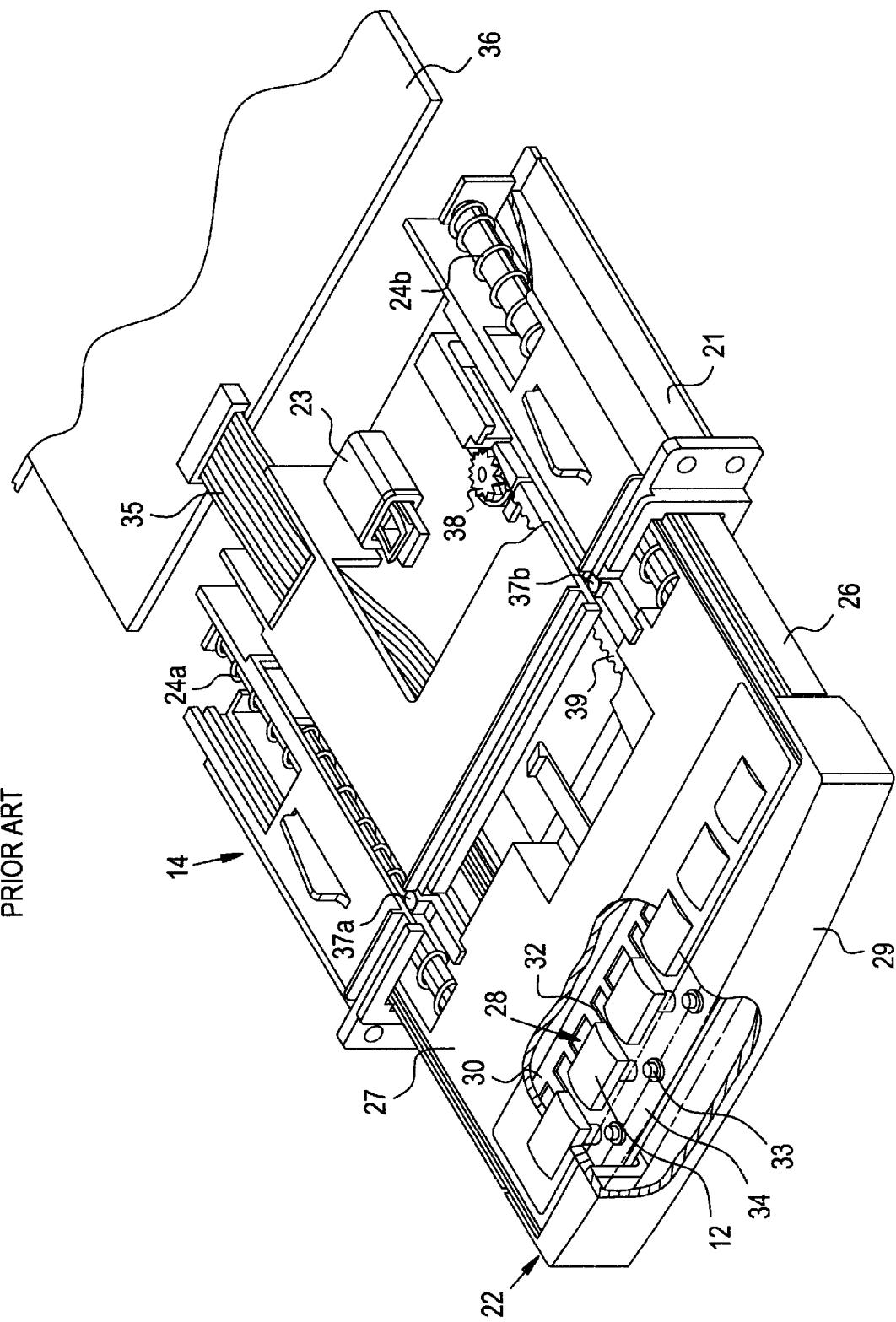
FIG. 2 is a partially cutaway view in perspective of a conventional snap door of a household electric appliance in its open condition.
Figure 3:
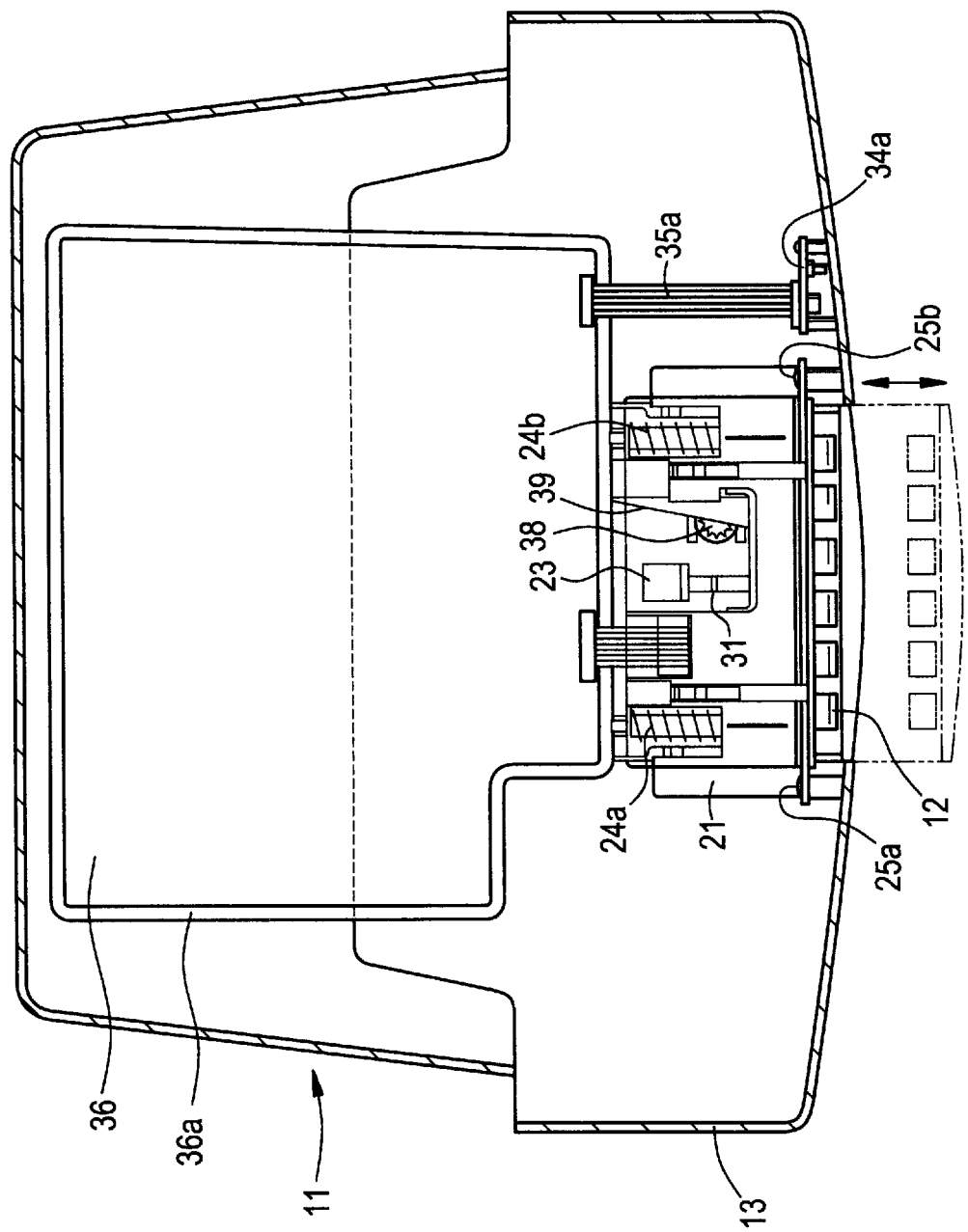
FIG. 3 is a side view, with portions broken away, showing the conventional snap door of the household electric appliance mounted to a television.
Figure 4:
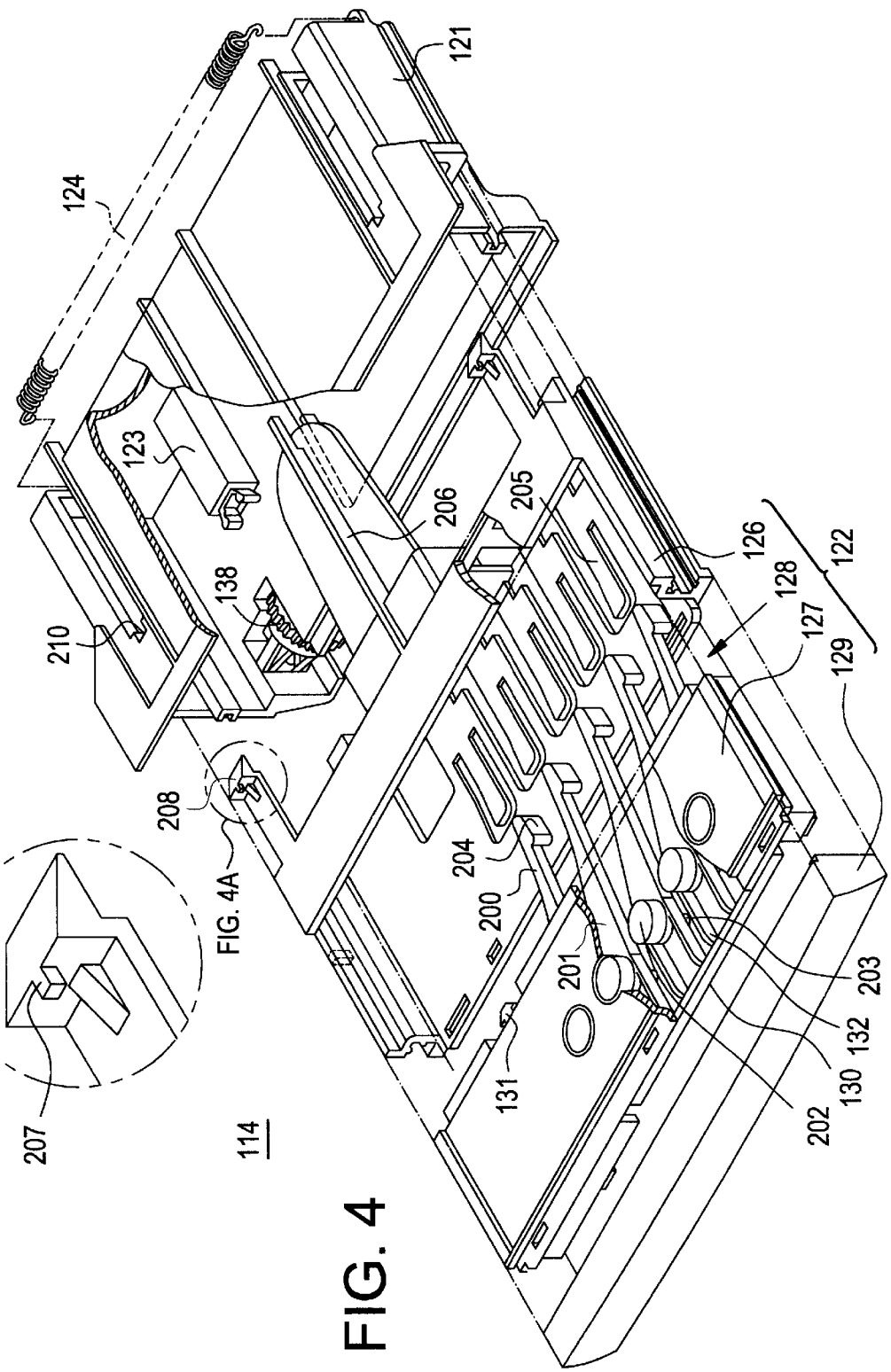
FIG. 4 is an exploded perspective view showing a snap door of a household electric appliance according to the present invention.
Figure 5:
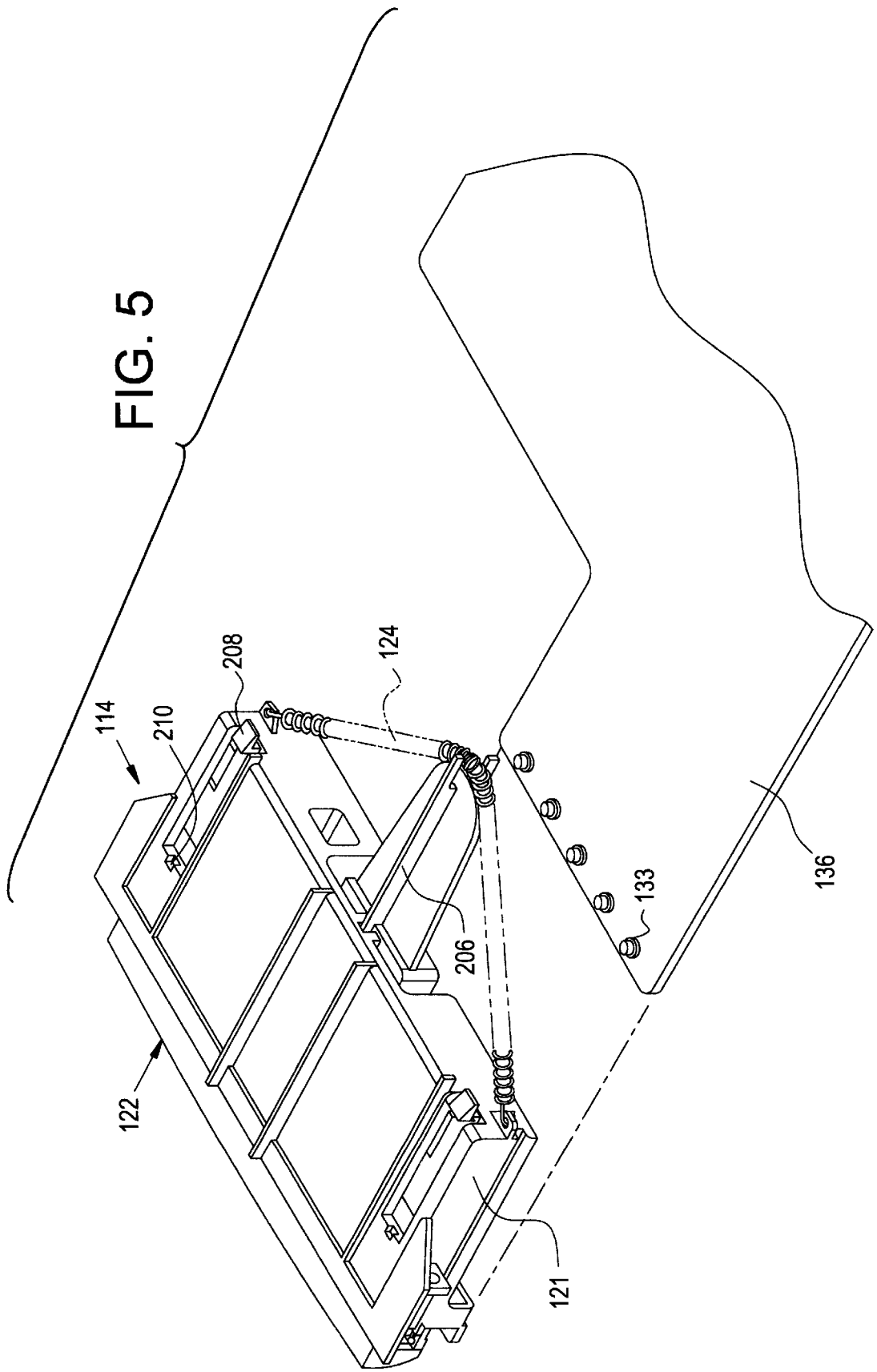
FIG. 5 is a rear view in perspective of the snap door according to the present invention in its closed condition when viewed from the rear side thereof.

FIGS. 4 to 11 illustrate the preferred embodiment of a snap door of a household electric appliance according to the present invention. Referring to FIGS. 4 to 11, the snap door 114 according to the present invention includes a door housing 121 and a door body 122 coupled for slidably moving forward and backward with respect to the door housing 121. Also included as parts thereof are a latch switch 123 for locking the door body 122 in the door housing 121 and a tension spring 124 for permitting the door body 122 to project forward out of the door housing 121 when the latch switch 123 is released.

The lower plane of the door housing 121 is partially opened for placing a PCB 136 mounted with a plurality of control switches 133 therein.

The door body 122 is formed by a lower case 126, an upper cover 127 coupled to the upper side of the lower case 126, and a knob assembly 128 provided to one side of the bottom plane of the upper cover 127. Further to these, a front cover 129 is coupled to one side of the front of the lower case 126 and the upper cover 127.

The knob assembly 128 has a knob holder 130, a plurality of remote control knobs 200 and a plurality of resilient bridge portions 132 extending between the knob holder 130 and the remote control knobs 200. The knob assembly 128 is attached to the lower plane of the upper cover 127 by means of the knob holder 130.

The respective remote control knobs 200 include an extension member 201 extending to the rear side from the resilient bridge portion 132, a control button 202 projecting from the front of an upper plane of the extension member 201, a downward projection 203 protruding from a lower plane of the extension member 201 and a switch operative projection 204 projecting downward from one end of the rear side of the extension member 201.

Figure 10:
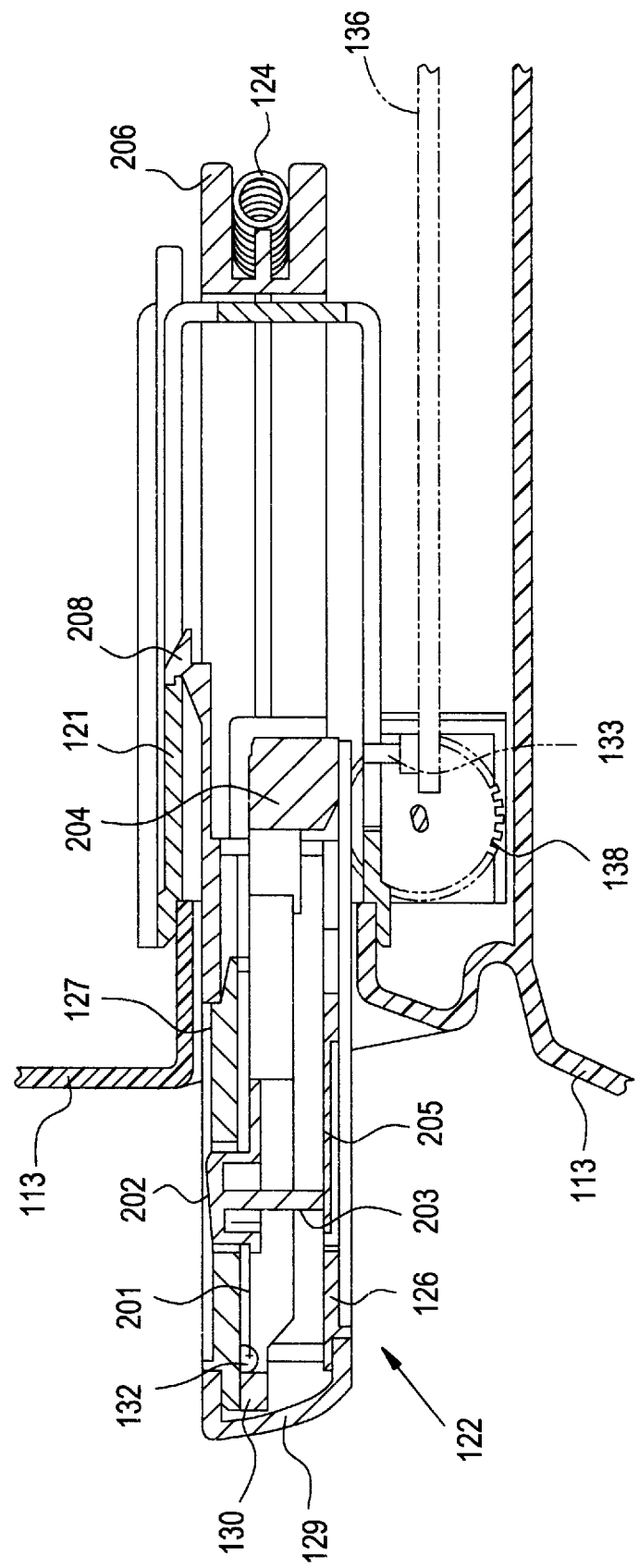
FIG. 10 is a sectional view taken along line X—X of FIG. 9.
Figure 11:
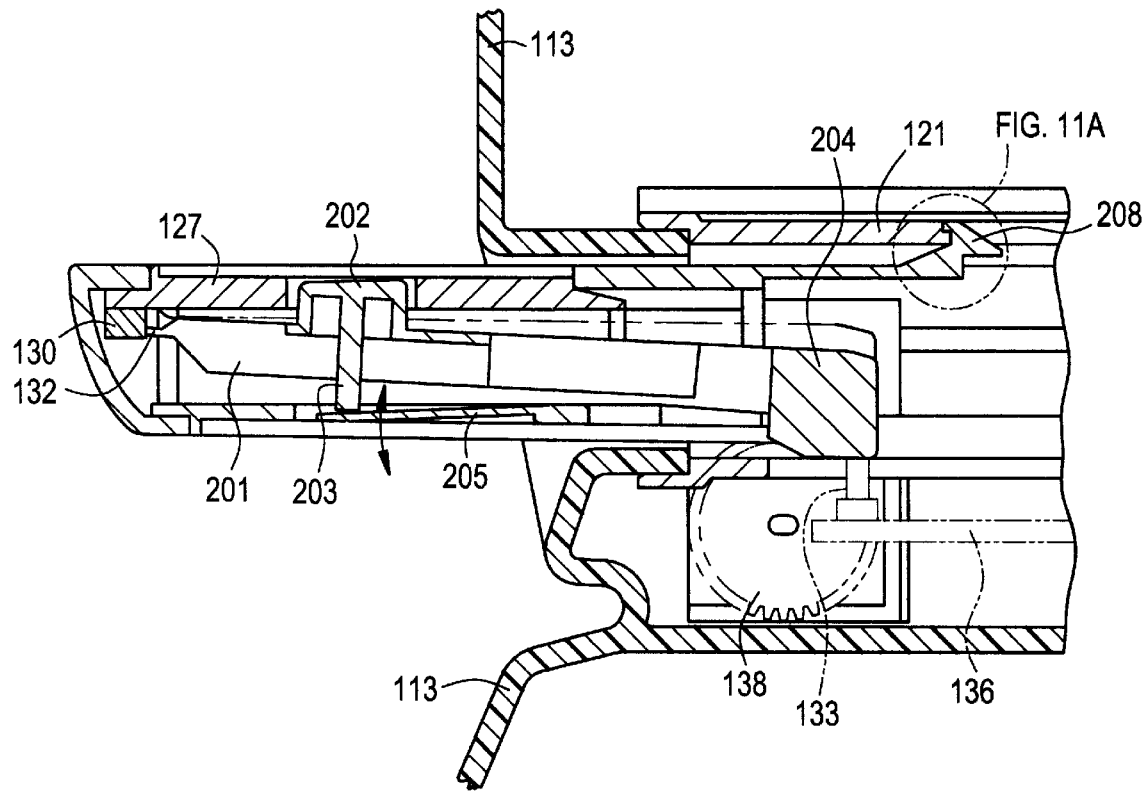
FIG. 11 is a sectional view showing the major parts of the snap door according to the present invention for illustrating an operational state of the remote control knob.
Figure 11A:
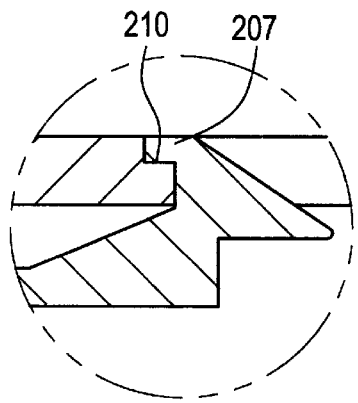

As best shown in FIGS. 10 and 11, the respective remote control knobs 200 are arranged such that the corresponding switch operative projections 204 are positioned first above the respective control switches 133 of the PCB 136 when the snap door 114 is opened, and the corresponding downward projections 203 are elastically supported upward by means of the respective resilient holding plates 205 furnished in corresponding portions of the lower case 126.

The extension members 201 of the respective remote control knobs 200 are bent to be slanted at a predetermined angle with respect to the central axis of the lower case 126. This is to prevent an unstable operation induced by a repeated manipulation such as right and left shaking of the knobs, which could occur due to the different positions of control buttons 202 and switch operative projections 204, and to overcome a drawback such as a limitation of the design due to routine design of the PCB.

The latch switch 123 is provided to one side of the rear upper plane of the door housing 121, and a hook 131 is projectingly installed to the upper cover 127 of the door body 122 where it corresponds to the latch switch 123 for being caught by the latch switch 123.

Both ends of the tension spring 124 are supported by both rear sides of the door housing 121, and the central portion thereof straddles a groove in the edge end of a center rail 206 that extends from the rear center to the rear side of the lower case 126.

The stoppers 208 respectively having small protrusions 207 for preventing the forward deviation of the door body 122 to the front of the door housing 121 possibly induced by the spring force of the tension spring 124 are furnished at both rear sides of the lower case 126. The door housing 121 is formed with small slots 210 corresponding in portion to the portions of the respective stoppers 208 to be fitted into the small protrusions 207, respectively.

As shown in FIGS. 4 to 11, reference numeral 138 denotes a damper gear for preventing abrupt movement of the door body 122 when the door body 122 is slidably moved with respect to the door housing 121, and reference numeral 139 is a rack provided at one side of the bottom plane of the lower case 126 of the door body 122 for meshing with the damper gear 138.

Figure 6:
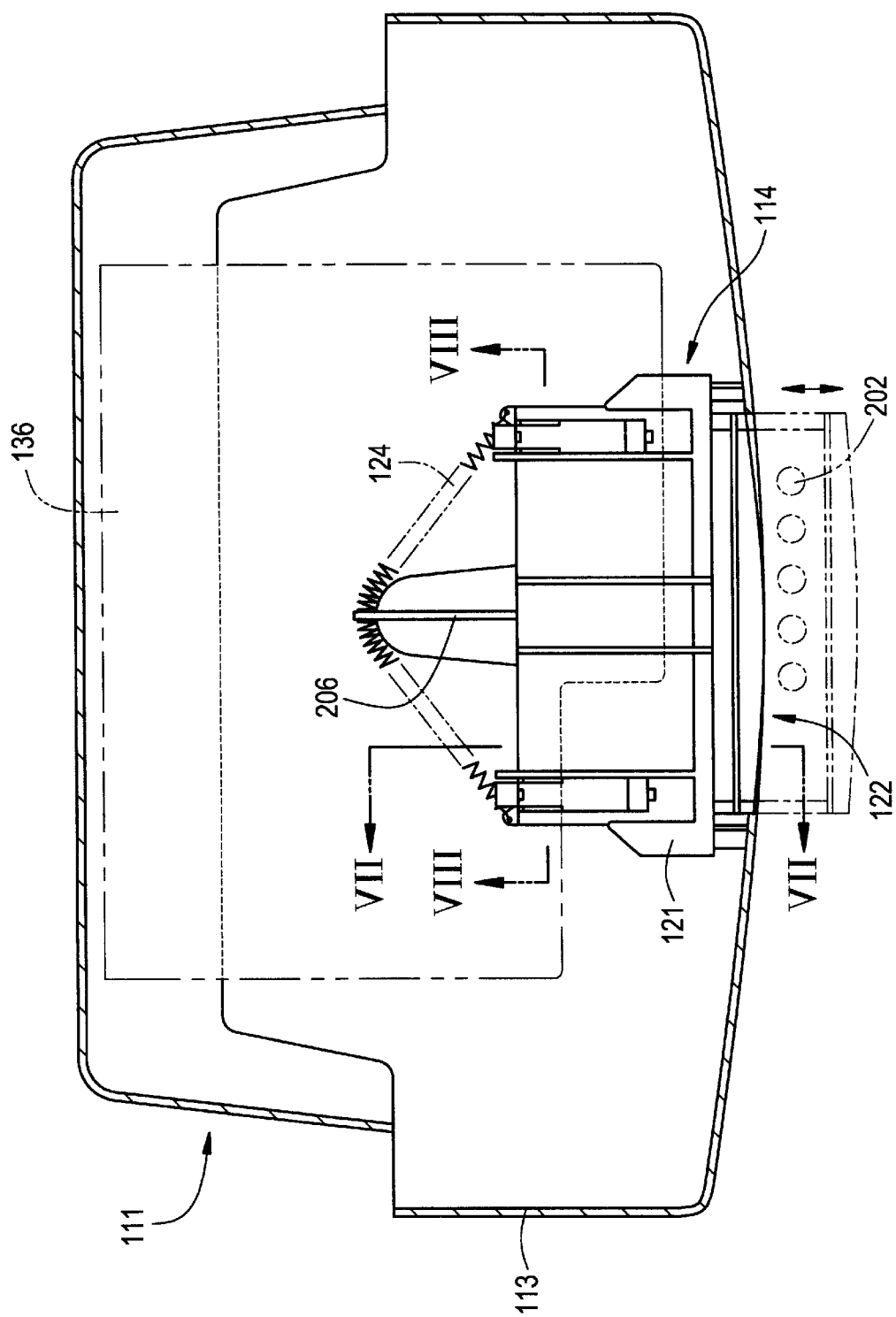
FIG. 6 is a plan view, with portions broken away, showing the snap door according to the present invention mounted in a television.
Figure 7:
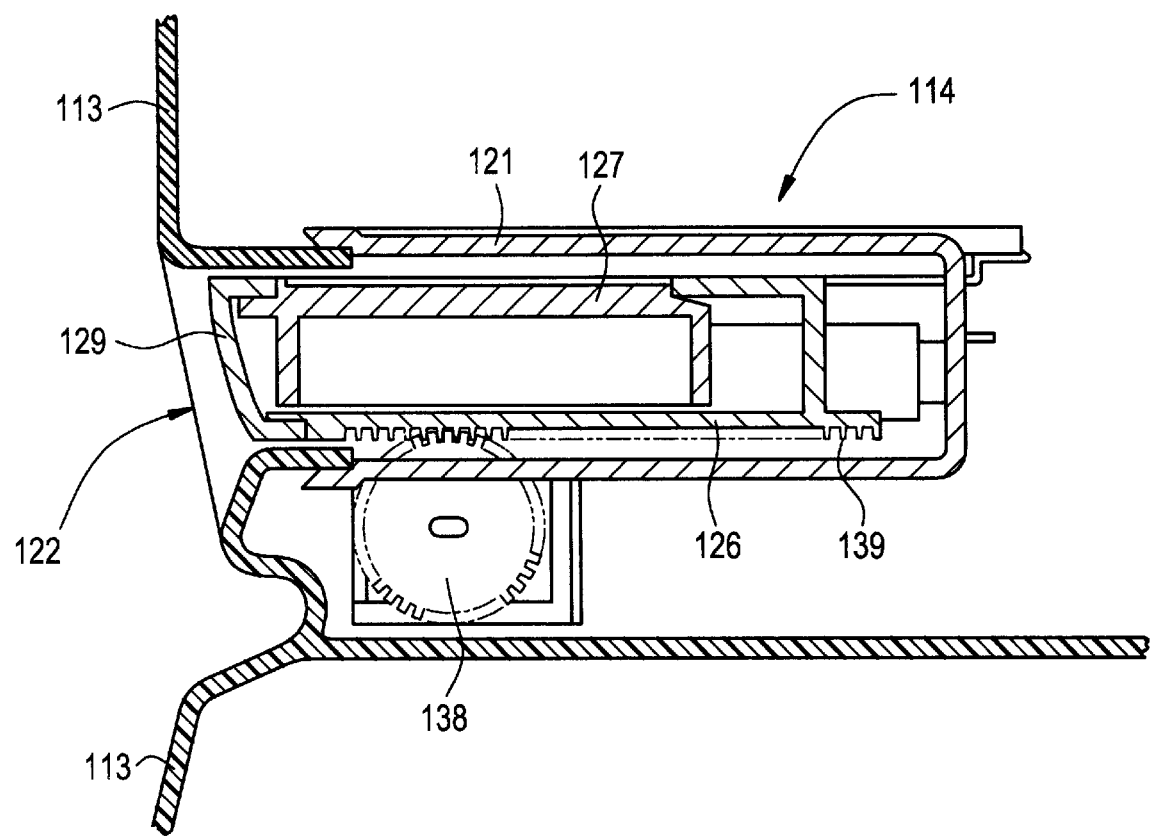
FIG. 7 is a sectional view taken along line VII—VII of FIG. 6.
Figure 9:
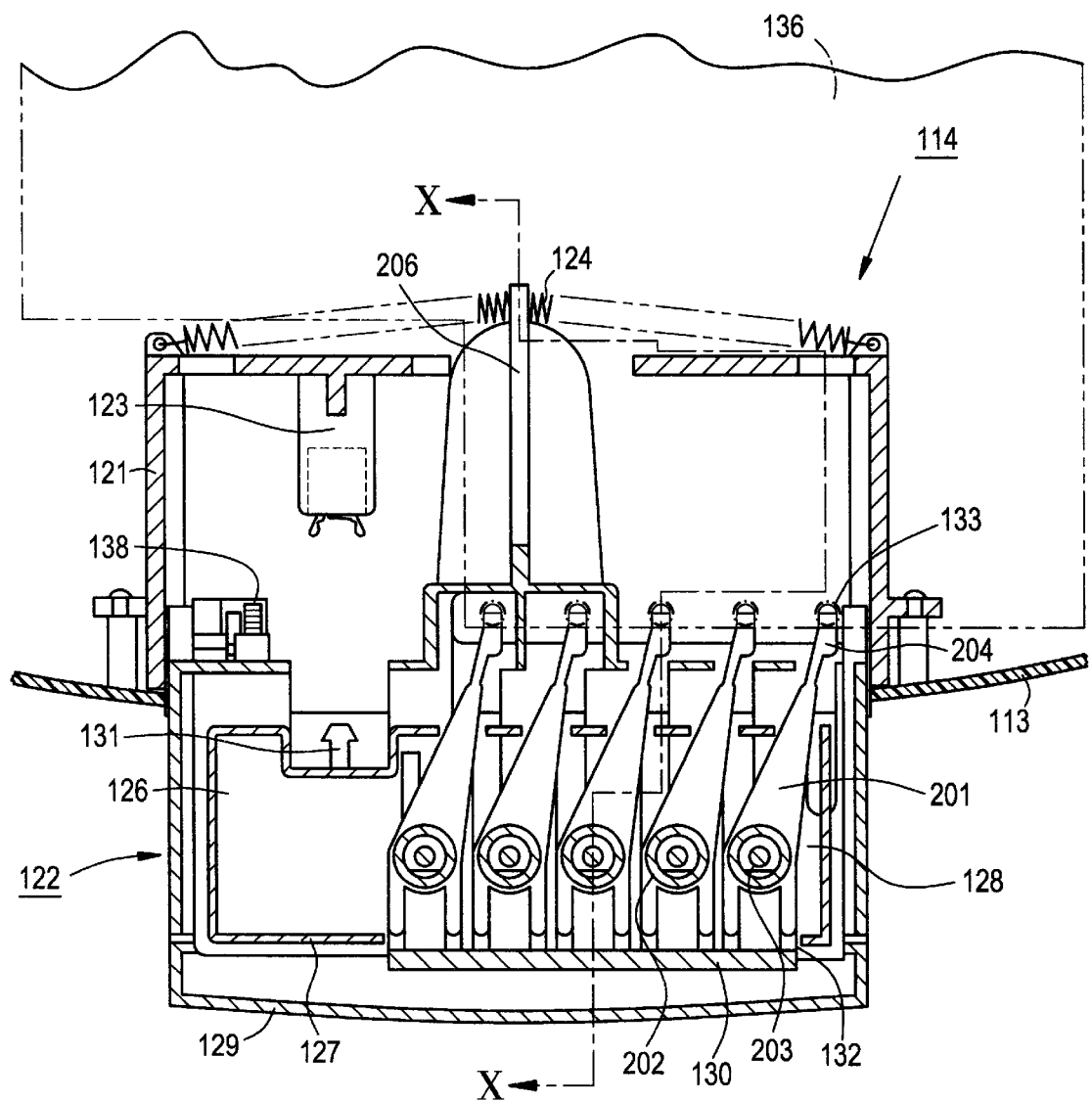
FIG. 9 is a plan view, with portions broken away, showing the major parts of the snap door according to the present invention in its open condition.

The snap door 114 formed as above, as shown in FIG. 6, is mounted to a cabinet 113 of the household electric appliance 111, such as a television, by means of an unshown plurality of screws. Once a user of the household electric appliance 111 presses the front plane of the closed door body 122 the latch switch 123 mutually catching hook 131 of the upper cover 127 of the door body 122 is released to allow the door body 122 to slide and protrude forward from the household electric appliance 111 by the spring force of the tension spring 124. At this time any abrupt movement of the door body 122 is blocked by the damper gear 138 meshing with the rack 139.

When the door body 122 protrudes out the front of the household electric appliance 111, as designated by a virtual line in FIG. 6, the control buttons 202 of the door body 122 are externally exposed. Thus, the user of the household electric appliance 111 presses the control buttons 202 to manipulate the control switches 133 arranged onto the main PCB 136 (refer to FIG. 5), thereby operating the household electric appliance 111.

When the user of the household electric appliance 111 presses a control button 202, the extension member 201 of the remote control knob 200 is, as shown in FIG. 11, rotated downward pivoting about the knob holder 130. By this operation, the switch operative projection 204 directly presses the control switch 133 on the main PCB 136.

At this time the door body 122 is positioned such that the respective protrusions 207 in stoppers 208 are fitted with the respective slots 210 installed in door housing 121 where they correspond to stoppers 208. This construction inhibits the door body 122 from being lowered below the door housing 121 regardless of the user's pressing of the control button 202.

When the user of the household electric appliance 111 releases pressure from the control button 202, the remote control knob 128 is returned to its original position by the elastic force of the resilient bridge portion 132 and the resilient holding plate 205 of the lower case 126.

By the user's pushing of the front plane of the door body 122 after finishing the manipulation of the household electric appliance 111, the door body 122 retreats inside the door housing 121 while overcoming the spring force of the spring 124 to be caught by the hook 131 of the upper cover 127 by means of the latch switch 123. By doing so, the control buttons 202 become hidden within the interior of the cabinet 113 of the household electric appliance 111.

As a result, in the snap door 114 of the household electric appliance according to the present invention, the main PCB 136 is placed at the direct lower side of the door housing 121, and respective control switches 133 on the main PCB 136 are directly actuated by means of the remote control knob 200. Accordingly, the overall size of the household electric appliance 111 installed with the snap door 114 can be significantly reduced while eliminating the need for separate parts such as the sub-PCB, control PCB, connector wire, and PCB holder, which were required for installing a conventional snap door.

Also, the door body 122 is ejected by the single tension spring 124, so that the door body 122 is subjected to a consistent spring force, which will prevent the shaking of the door body 122 with respect to the door housing 121.

In the aforementioned snap door 114 of the household electric appliance according to the present invention, small protrusions 207 in the stoppers 208 of the door body 122 engage small slots 210 of the door housing 121 when the door body 122 is fully ejected from the door housing 121 to prevent the door body 122 from being pushed downward with respect to the door housing 121 even when the user presses the control button 202 of the snap door 114 in its open condition.

While the present invention has been particularly shown and described with reference to a particular embodiment thereof, it will be understood by those skilled in the art that various changes in form and details may be effected therein without departing from the spirit and scope of the invention as defined by the appended claims.

What is claimed is:

1. A snap door for a household electric appliance comprising:

a door housing;

a door body coupled to said door housing for slidably moving into and out of said door housing;

a PCB with a plurality of control switches positioned thereon;

said PCB positioned in a lower part of said door housing whereby said door body slides over said PCB as it moves slidably into and out of said housing;

a knob assembly in said door body;

said knob assembly including remote control knobs for permitting user actuation of said control switches when said door body is in a position outside of said door housing; and said knob assembly and PCB being positioned so that said remote control knobs are positioned adjacent respective ones of said control switches when said door body is in its position outside of said door housing, so that said control knobs will contact said respective control switches when said control knobs are depressed.

2. A snap door as claimed in claim 1, further comprising:

a means for locking said door body in said door housing; and a means for ejecting said door body out of said door housing when said door locking means is released.

3. A snap door according to claim 2, wherein said door body comprises:

a lower case;

an upper cover coupled to an upper side of said lower case;

a front cover coupled to one side of the front of said lower case and upper cover; and wherein said remote control knobs are attached to one side of a bottom plane of said upper cover.

4. A snap door of a household electric appliance according to claim 3, wherein said knob assembly further comprises a knob holder and a plurality of resilient bridge portions extending from said knob holder to said remote control knobs, said knob holder being attached to the lower plane of said upper cover.

5. A snap door according to claim 4, wherein each of said respective remote control knobs comprises:

an extension member extending towards said door housing from a respective one of said resilient bridge portions;

a control button projectingly installed at the front side of an upper plane of said extension member;

a downward projection protrudingly positioned at a lower plane of said extension member;

a switch operative projection downwardly protruding from the remote end of said extension member; and a resilient holding plate provided in said lower case for upwardly and elastically supporting said downward projections.

6. A snap door according to claim 4, wherein said extension members of respective remote control knobs are bent to slant at a predetermined angle with respect to a central axis of said lower case.

7. A snap door according to claim 2, wherein said door body locking means is comprised of a latch switch arranged to one side of the rear upper plane of said door housing, and a hook member protrudingly installed on a portion of said door body corresponding to said latch switch for being caught by said latch switch.

8. A snap door according to claim 2, wherein said door body further comprises a center rail extending to the rear side of said door body, and a groove in an edge end of said central rail, and wherein said door body ejection means is comprised of a tension spring having both ends supported by both rear sides of said door housing, respectively and a central portion caught by said groove in said edge end of said center rail.

9. A snap door according to claim 8, further comprising: stoppers respectively having protrusions provided on both rear sides of said door body for preventing the forward deviation of said door body from said door housing by means of a spring force of said tension spring, and for preventing the door body from being pushed downward with respect to the door housing even when the user presses the control button of the snap door in its open condition, and said door housing is formed with slots at portions corresponding to the positions of said respective stoppers for being fitted into said protrusions, respectively.

\* \* \* \* \*